(12) United States Patent
Morozumi (10) Patent No.: US 6,559,545 B2
(45) Date of Patent: May 6, 2003

(54) SEMICONDUCTOR DEVICES AND METHODS FOR MANUFACTURING SEMICONDUCTOR DEVICES

(75) Inventor: Yukio Morozumi, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/160,905

(22) Filed: Jun. 3, 2002

(65) Prior Publication Data

US 2002/0146901 A1 Oct. 10, 2002

Related U.S. Application Data (62) Division of application No. 09/776,391, filed on Feb. 3, 2001, now Pat. No. 6,399,477.

(30) Foreign Application Priority Data

Feb. 3, 2000 (JP) ......................................... 2000-026368

(51) Int. Cl.[7] ........................ H01L 23/48; H01L 23/52; H01L 29/40
(52) U.S. Cl. ....................... 257/758; 257/748; 257/750; 257/752; 257/760; 257/762; 257/765; 257/774; 257/775
(58) Field of Search ................................. 257/748, 750, 257/752, 758, 760, 762, 765, 774, 775

(56) References Cited

U.S. PATENT DOCUMENTS 6,191,023 B1 * 2/2001 Chen ........................... 438/612
6,198,170 B1 * 3/2001 Zhao ........................... 257/784

FOREIGN PATENT DOCUMENTS

| EP | 0913863 | * 5/1999 |
| JP | 11-135506 | * 5/1999 |

* cited by examiner

*Primary Examiner*—Albert W. Paladini
*Assistant Examiner*—David A. Zarneke
(74) *Attorney, Agent, or Firm*—Konrad Raynes Victor & Mann, LLP; Alan S. Raynes (57) ABSTRACT

In a method for manufacturing a semiconductor device in which wiring layers are formed by a damascene method, certain embodiment relate to a manufacturing methods and semiconductor devices, in which a bonding pad section having a multiple-layered structure can be formed by a simple method without increasing the number of process steps. One embodiment includes a method for manufacturing a semiconductor device in which a layer including at least a bonding pad section is formed by a damascene method, the method comprising the steps of: (a) forming an opening region 80a for the bonding pad section in an uppermost dielectric layer 22, the opening region being divided by dielectric layers 22a of a specified pattern and including a plurality of partial opening sections 81; (b) successively forming a plurality of conduction layers 820, 840 composed of different materials over the dielectric layer; and (c) removing excess portions of the plurality of conduction layers 820, 840 and the dielectric layer 22 to planarize the plurality of conduction layers and the dielectric layer, to thereby form a bonding pad section 80 in which a plurality of conduction layers 82, 84 composed of different materials are exposed in each of the partial opening sections 81 of the opening region 80a.

8 Claims, 3 Drawing Sheets

SEMICONDUCTOR DEVICES AND METHODS FOR MANUFACTURING SEMICONDUCTOR DEVICES

This application is a divisional of U.S. application Ser. No. 09/776,391 filed Feb. 3, 2001 U.S. Pat. No. 6,399,477, which is hereby incorporated by reference in its entirety.

Japanese Patent Application No. 2000-26368(P), filed Feb. 3, 2000, is hereby incorporated by reference in its entirety. U.S. patent application Ser. No. 09/776,391 filed on Feb. 3, 2001, entitled "Semiconductor Devices and Methods for Manufacturing The Same," invented by Yukio Morozumi, docket no. 15.34/5588, is hereby incorporated by reference in its entirety.

TECHNICAL FIELD

The present invention relates to semiconductor devices and methods for manufacturing semiconductor devices, and more particularly, preferred embodiments relate to semiconductor devices with a bonding pad section (an electrode for external connection) that has a characteristic structure and methods for manufacturing the same.

RELATED ART

As semiconductor devices have been further miniaturized in recent years, wiring layers are formed in multiple layers in many more occasions. In a process for manufacturing semiconductor devices, the number of process steps for forming wiring layers and contact layers for electrically connecting the wiring layers has increased with respect to the total number of process steps required for manufacturing the semiconductor devices. Accordingly, the method for forming wiring layers and contact layers has currently become an important issue in the process for manufacturing semiconductor devices. So-called damascene methods are known among methods that facilitate the formation of wiring layers and contact layers.

In a damascene method, specified wiring grooves are formed in a dielectric layer, a wiring material such as aluminum alloy or copper is deposited in the wiring grooves, excess portions of the wiring material are polished and removed by a chemical-mechanical polishing method (hereafter referred to as a "CMP" method) to embed the wiring material in the wiring grooves to form wiring layers. In particular, when copper is used as the wiring material, a reactive ion etching is difficult to employ, and the use of a damascene method is considered to be more promising. Many techniques in the damascene methods have been proposed. For example, Japanese laid-open patent application HEI 11-135506 describes a method for manufacturing a bonding pad section in a wiring structure that is formed by a damascene method.

According to the manufacturing method of Japanese laid-open patent application HEI 11-135506, the bonding pad section is formed in a manner described as follows. A copper wiring is formed over an uppermost dielectric layer by a damascene method. Then, a dielectric protection layer is formed over the entire surface of the dielectric layer and the copper wiring. The dielectric protection layer is patterned to form an opening region in a region where a bonding pad section is to be formed. Then, a copper oxide film on the surface of the copper wiring, which is formed during a step of removing a resist layer or a photo-etching step, is removed by a dry etching method. Thereafter, an aluminum layer is deposited thereon, and then a selective etching is conducted to pattern the aluminum layer such that the aluminum layer covers the opening region. In this manner, the bonding pad section in which the aluminum layer is deposited is formed over the copper wiring. The reference also describes a method of depositing an aluminum layer and then removing excess portions of the aluminum layer by a CMP method to embed the aluminum layer in the opening region, instead of selectively etching and patterning the aluminum layer after the aluminum layer is deposited.

The presence of the aluminum layer over the surface of the bonding pad section provides an improved bonding property with respect to gold and the like.

However, the process described above has the following problems. When the aluminum layer is patterned by a selective etching after the copper layer is formed, the step of forming the aluminum layer, the photolithography step and the etching step are required in addition to the damascene process. This increases the number of process steps. Furthermore, the selective etching requires an etcher for aluminum layers that are not used in the damascene process. When the aluminum layer is planarized by a CMP method after the copper wiring is formed, such a CMP step is added. As a result, the number of process steps increases. Also, the process described in the reference requires a step of removing copper oxide formed on the exposed surface of the copper wiring by a gas containing oxygen plasma and hydrofluoric acid.

SUMMARY

Embodiments include a method for manufacturing a semiconductor device in which at least a layer including a bonding pad section is formed by a damascene method. The method includes the steps of: (a) forming an opening region for the bonding pad section in an uppermost dielectric layer, the opening region being divided by dielectric layers of a specified pattern and including a plurality of partial opening sections; (b) successively forming a plurality of conduction layers comprising different materials over the dielectric layer; and (c) removing excess portions of the plurality of conduction layers and the dielectric layer to planarize the plurality of conduction layers and the dielectric layer, to thereby form a bonding pad section in which a plurality of conduction layers comprising different materials are exposed in each of the partial opening sections of the opening region.

Another embodiment relates to a semiconductor device including a plurality of wiring layers and dielectric layers interposed between the mutual wiring layers. A bonding pad section is located in an uppermost dielectric layer. The bonding pad section includes an opening region having a plurality of partial opening sections divided by dielectric layers. A plurality of conduction layers each comprising different materials and exposed are located in each of the partial opening sections.

Another embodiment relates to a method for manufacturing a semiconductor device in which at least a layer including a bonding pad section is formed by a damascene method. The method includes forming an opening region for the bonding pad section in an uppermost dielectric layer, the opening region comprising a plurality of sub-openings divided from one another by dielectric walls. A plurality of conduction layers are formed into the sub-openings. Excess portions of the plurality of conduction layers and the dielectric layer are removed to planarize the plurality of conduction layers and the dielectric layer, to thereby form a bonding pad section in which a plurality of conduction layers are exposed in each of the sub-openings of the opening region.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

In a method for manufacturing a semiconductor device in which a layer including a bonding pad section is formed by a damascene method, it is an object of certain embodiments of the present invention to provide method for manufacturing semiconductor devices and semiconductor devices, in which a bonding pad section having exposed conduction layers composed of plural materials can be formed without increasing the number of process steps.

In a method for manufacturing a semiconductor device in accordance with one embodiment of the present invention, at least a layer including a bonding pad section is formed by a damascene method, and the method comprises the steps (a)~(c) as follows: (a) forming an opening region for the bonding pad section in an uppermost dielectric layer, the opening region being divided by dielectric layers of a specified pattern and including a plurality of partial opening sections; (b) successively forming a plurality of conduction layers composed of different materials over the dielectric layer; and (c) removing excess portions of the plurality of conduction layers and the dielectric layer to planarize the plurality of conduction layers and the dielectric layer, to thereby form a bonding pad section having a plurality of conduction layers composed of different materials being exposed in the partial opening sections of the opening region.

By the manufacturing method described above, the opening region for the bonding pad section is formed in the uppermost dielectric layer. Also, the opening region for the bonding pad section has the plurality of partial opening sections divided by the dielectric layers of a specified pattern. The plurality of conduction layers composed of different materials are successively deposited over the dielectric layer in a manner to embed the opening region. By different materials it is meant that the materials have different compositions. For example, different materials may include the same element in differing quantities. Furthermore, the plurality of conduction layers and the dielectric layer are planarized by, for example, a CMP method, to thereby form the bonding pad section having the plurality of conduction layers composed of different materials being exposed in the partial opening sections of the opening region.

The manufacturing method described above can form the bonding pad section in which a plurality of exposed portions of the plurality of conduction layers composed of different materials are arranged in a specified pattern. By appropriately selecting materials for the plurality of conduction layers, the bonding pad section can be used for bonding with wires or bumps that may be formed from a variety of materials, such as, for example, aluminum, gold, silver, copper or an alloy of the aforementioned metals, in other words, the bonding pad section can be formed with a high level of applicability to these bonding.

In the manufacturing method described above, in the step (b), the plurality of conduction layers may preferably be formed to a film thickness that allows the plurality of conduction layers to remain after the step (c) of planarization. By setting the thickness of the plurality of conduction layers in this manner, the bonding pad section can be formed in a manner that the plurality of conduction layers composed of different materials are securely exposed in the respective partial opening sections of the opening region.

Furthermore, in the step (a), a wiring groove for an uppermost wiring layer may preferably be formed in the uppermost dielectric layer together with the opening region for the bonding pad section. Also, in the step (b), a conduction layer for the wiring layer can mainly be deposited in the wiring groove.

In accordance with certain embodiments of the present embodiment, the bonding pad section and the uppermost wiring layer can be simultaneously formed in a damascene process for forming the bonding pad section. Therefore, the bonding pad section can be formed with a simple process without increasing the number of steps of the damascene process or adding steps of forming and patterning other films after the damascene process, which improves the yield and reduces the cost.

In the embodiment described above, the conduction layer for the wiring layer may preferably be a lowermost layer among the plurality of conduction layers. Also, at least one conduction layer above the conduction layer for the wiring layer is deposited in the opening region for the bonding pad section. An appropriate material may preferably be selected for the conduction layer that is provided above the conduction layer for the wiring layer in order to cope with bonding by bumps or wires that may be formed from a variety of conduction materials.

Manufacturing methods in accordance with the present invention may also include the following embodiments.

(1) After the step (c), the manufacturing method may further include the steps of forming a dielectric protection layer and patterning the dielectric protection layer to have an opening section that exposes at least a part of the bonding pad section. With these steps included, an opening section can be formed in the protection layer formed in the uppermost layer.

(2) The layer including the bonding pad section may be formed by a single damascene process or a dual damascene process.

(3) The manufacturing method may include, after the step (a), the step of forming at least one of a barrier layer and a cohesion layer over a surface of the opening region for the bonding pad section. An appropriate material may be selected for the barrier layer according to the material of the wiring layer. For example, when the lowermost layer of the bonding pad section is formed from a copper-base material, the barrier layer may be formed from a high-melting point metal, including, for example, tantalum, titanium, tantalum nitride, titanium nitride, or a compound of these metals. The cohesion layer may be formed from a metal, such as, for example, titanium, tantalum, niobium, tungsten, and alloys including the aforementioned metals.

(4) A material for the conduction layer for the wiring layer can be selected mainly in view of the function of a wiring layer. A material for the conduction layer provided above the conduction layer for the wiring layer can be selected mainly in view of the function of a bonding pad section. In view of these functions, the following combinations can be suggested as examples.

The conduction layer for the wiring layer is formed from a metal layer composed of at least one type selected from aluminum, copper, silver and an alloy of the aforementioned metals, and the conduction layer provided above the conduction layer for the wiring layer is formed from a metal layer composed of at least one type selected from aluminum, gold and an alloy of the aforementioned metals.

(5) In addition, in the step (c) as described above, the planarization can be conducted by a CMP method.

A semiconductor device in accordance with certain embodiments of the present invention comprises a plurality of wiring layers and dielectric layers interposed between the mutual wiring layers, and a bonding pad section in an uppermost dielectric layer. The bonding pad section comprises an opening region having a plurality of partial opening sections divided by dielectric layers, and a plurality of conduction layers composed of different materials are exposed in the partial opening sections.

The semiconductor device described above has the bonding pad section in which a plurality of exposed portions of the plurality of conduction layers composed of different materials are arranged in a specified pattern. Therefore, as described above, by selecting appropriate materials for the plurality of conduction layers, the bonding pad section can be used for bonding with wires or bumps that may be formed from a variety of materials, in other words, the bonding pad section can be formed with a high level of applicability to various bonding methods.

Not only materials for the conduction layers but also types of materials for the conduction layers and area ratios among the conduction layers may be selected to form bonding pad sections of a variety of embodiments.

Also, because the bonding pad section includes the dielectric layers of a specified pattern that form the partial opening sections, various advantages are obtained. For example, the generation of a dishing in the CMP step is prevented, contact areas of the conduction layers with the barrier layer or the cohesion layer increase so that the cohesion of the conduction layers improve, the stress that is generated by the bonding operation and works on the bonding pad section is dispersed.

Moreover, an uppermost wiring layer may preferably be disposed over the uppermost dielectric layer together with the bonding pad section. In the semiconductor device in accordance with the present embodiment, the conduction layer for the wiring layer is formed from a lowermost conduction layer among the plurality of conduction layers. Accordingly, a material for the conduction layer for the wiring layer can be selected mainly in view of the function of a wiring layer. A material for the conduction layer provided above the conduction layer for the wiring layer can be selected mainly in view of the function of a bonding pad section. By appropriately selecting materials for the conduction layers, the wiring layer and the bonding pad section can be highly optimized.

For example, when copper or copper alloy (hereafter referred to as "copper-base material") is used for the conduction layer for the wiring layer, aluminum or aluminum alloy (hereafter referred to as "aluminum-base material") can be used for the other conduction layer at the bonding pad section. As a result, good quality bonding can be achieved when gold, aluminum, an alloy thereof, or solder is used for bumps or wires.

Materials for the plurality of conduction layers are selected in view of the function of the wiring layer and the bonding pad section, film forming methods, device assembly methods, mounting methods and the like.

In the semiconductor device in accordance with the embodiment described above, each of the partial opening sections that form the opening region has concentrically disposed different conduction layers in which the conduction layer for the wiring layer is provided in an outermost layer and an optimum conduction layer is provided inside of the conduction layer for the wiring layer. The conduction layer provided inside may be composed of a single conduction layer or plural conduction layers Furthermore, a dielectric protection layer may preferably be formed over the uppermost layer and the layer including the bonding pad section. The protection layer has an opening section that exposes at least a portion of the bonding pad section.

Preferred embodiments of the present invention are described below with reference to the accompanying drawings.

Figure 5:
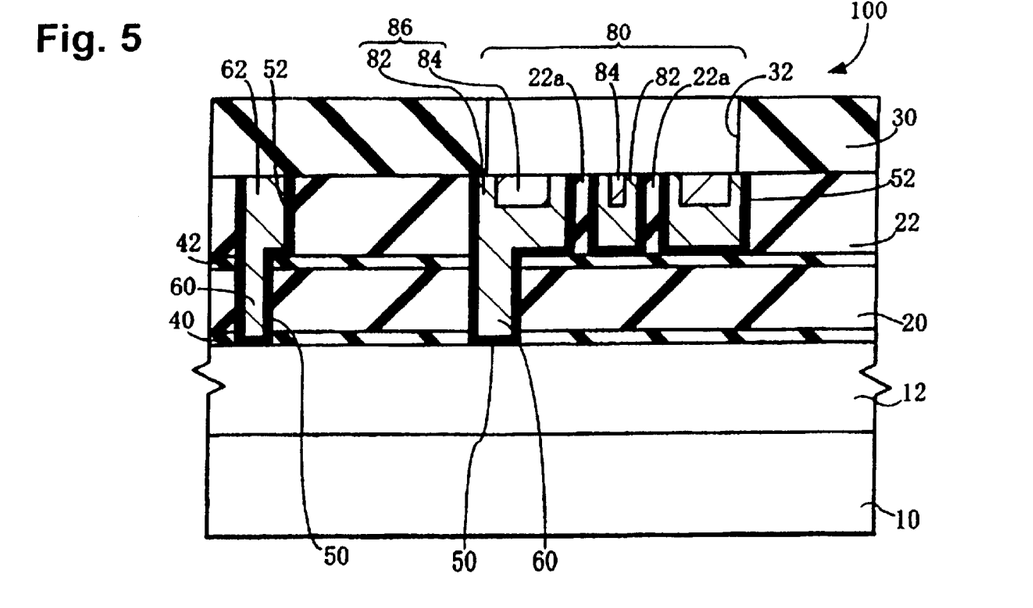
FIG. 5 schematically shows a cross-sectional view illustrating one step of a method for manufacturing a semiconductor device in accordance with an embodiment of the present invention.

A semiconductor device in accordance with an embodiment of the present invention is described. FIG. 5 schematically shows a cross-sectional view of a semiconductor device 100 in accordance with an embodiment of the present invention. FIG. 5 shows an example of a semiconductor device having an uppermost metal wiring layer and a bonding pad section.

The semiconductor device 100 has a layered structure in which an intermediate region 12 is formed over a silicon substrate 10. An uppermost interlayer dielectric layer 20 and an uppermost dielectric layer 22 are deposited over the intermediate region 12.

A via contact layer 60 is formed in the uppermost interlayer dielectric layer 20. An uppermost wiring layer 62 and a bonding pad section 80 (to be described below in greater detail) are formed in the uppermost dielectric layer 22.

In this example, a mask layer 42 is formed between the uppermost interlayer dielectric layer 20 and the uppermost dielectric layer 22. An interlayer barrier layer 40 is formed between the uppermost interlayer dielectric layer 20 and an underlying dielectric layer. In other words, when a lower layer is an interlayer dielectric layer having a via-contact layer and an upper layer is a dielectric layer having a wiring layer, a mask layer is formed between these two layers.

The interlayer barrier layer may function in one aspect to prevent the materials of the wiring layer and the via-contact layer from diffusing in dielectric layers such as the interlayer dielectric layer. The mask layer mainly functions as a mask and an etching stopper when via holes are formed by a dual-damascene method.

The interlayer barrier layer is provided, as needed depending on the materials of the wiring layer and the via-contact layer. For, example, the interlayer barrier layer is provided when at least one of the wiring layer and the via-contact layer is composed of a material such as a copper-base material that is likely to diffuse into the dielectric layer composed of silicon oxide. The interlayer barrier layer can be formed from a material that can prevent copper diffusion, such as, for example, silicon nitride, silicon nitride oxide and silicon carbide. When the wiring layer and the via-contact layer are composed of materials such as aluminum-base materials that are difficult to diffuse into the dielectric layer composed of silicon oxide, the interlayer barrier layer is not necessarily required. However, even in such a case, the interlayer barrier layer may preferably be formed for processing purposes because it functions as an etching stopper.

Some of the layers of the embodiment shown in FIG. 5 are described below in greater detail.

Silicon Substrate 10 And Intermediate Region 12: Semiconductor devices such as MOSFETs, bipolar transistors and the like, wiring layers and element isolation regions are formed over a surface of the silicon substrate 10.

The intermediate region 12 has a known layered structure. For example, the intermediate region 12 may include one or more sets of an interlayer dielectric layer formed with an interlayer contact layer such as a via-contact layer and a dielectric layer formed with a wiring layer.

Uppermost Interlayer Dielectric Layer 20: The uppermost interlayer dielectric layer is formed over the intermediate region 12 through the interlayer barrier layer 40. The via-contact layer 60 is formed in the uppermost interlayer dielectric layer 20. The via-contact layer 60 connects a wiring layer in the intermediate region 12 that is formed below the uppermost interlayer dielectric layer 20 to the uppermost wiring layer 62. The via-contact layer 60 has side and bottom surfaces that are preferably covered by a barrier layer 50.

Uppermost Dielectric Layer 22: The uppermost dielectric layer 22 is formed over the uppermost interlayer dielectric layer 20 through the mask layer 42. The uppermost wiring layer 62 and the bonding pad section 80 are formed at specified locations of the uppermost dielectric layer 22.

The via-contact layer 60 and the uppermost wiring layer 62 are integrally formed from a conductive material that is filled in an opening section having a specified pattern. The barrier layer 52 is formed over a surface of the uppermost wiring layer 62 (except an upper surface of the wiring layer 62). The barrier layer 50 formed over the surface of the via-contact layer 60 and the barrier layer 52 formed over the surface of the uppermost wiring layer 62 may be formed in the same film forming step and connected to each other in one piece. Similarly, the barrier layers 50 and 52 are continuously formed over surfaces of the via-contact layer 60 and the bonding pad section 80 (except an upper surface of the bonding pad section 80), respectively. In this embodiment, the bonding pad section 80 is connected to a lower wiring layer through the via-contact layer 60.

The barrier layer is provided, as needed depending on the materials of the wiring layer and the via-contact layer. For, example, the barrier layer is provided when the wiring layer and the via-contact layer are composed of a material such as a copper-base material that is likely to diffuse into a dielectric layer that is composed of silicon oxide. The barrier layer can be formed from a material that can prevent copper diffusion such as a high-melting point metal, such as, for example, tantalum, titanium, tungsten, a nitride thereof, or a stacked layered body of the aforementioned materials.

When the wiring layer and the via-contact layer are composed of materials such as aluminum-base materials that are difficult to diffuse into the dielectric layer that is composed of silicon oxide, the barrier layer is not necessarily required. However, even in such a case, a layer composed of one of high-melting point metals or a compound thereof may preferably be formed over surfaces of the wiring layer and the via-contact layer in order to improve the embedding property and contact resistance of the wiring material.

In accordance with certain embodiments of the present invention, the stacked layered structure of the barrier layer and the wiring layer may be formed from Ti/TiN/Al—Cu, Ti/Al—Cu, Ta/TaN/Al—Cu, Nb/Al—Cu and the like, when the wiring layer is mainly formed from an aluminum alloy layer. The stacked layered structure may be formed from Ti/TiN/Cu, Ta/TaN/Cu, WN/Cu and the like when the wiring layer is mainly formed from copper.

Bonding Pad Section 80: The bonding pad section 80 includes the barrier layer 52, a first conduction layer 82 formed along an internal wall of the barrier layer 52, and a second conduction layer 84 formed inside the base conduction layer 82. In other words, the bonding pad section 80 has a multiple-layered structure of the first conduction layer 82 and the second conduction layer 84. The first conduction layer 82 is formed in the same step in which the uppermost wiring layer 62 is formed, and consequently has the same material as that of the wiring layer 62.

Figure 2:
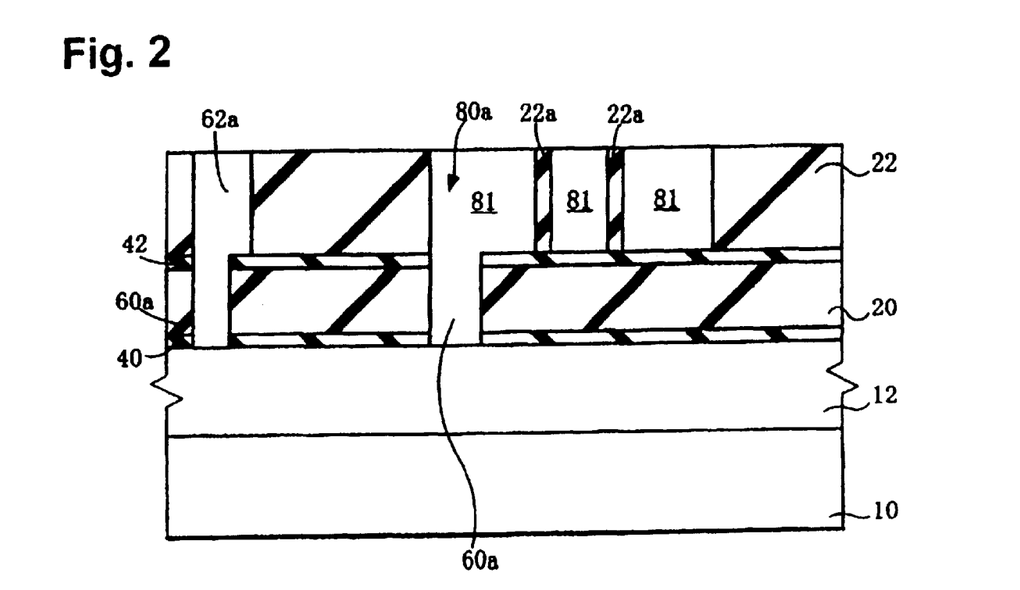
FIG. 2 schematically shows a cross-sectional view illustrating one step of a method for manufacturing a semiconductor device in accordance with an embodiment of the present invention.
Figure 6:
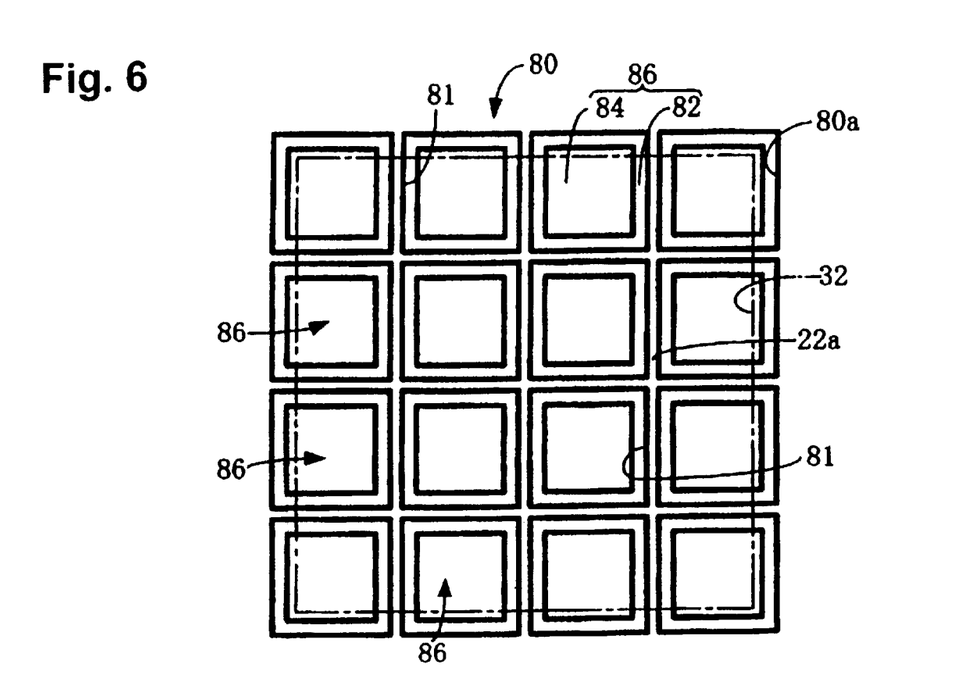
FIG. 6 schematically shows a partial plan view of a bonding pad section of the semiconductor device shown in FIG. 5.

FIG. 6 schematically shows a plan view of the bonding pad section 80. It is noted that FIG. 2 shows partial opening sections 81 having a pattern different from the pattern shown in FIG. 6 for the purpose of simplifying the figure.

As shown in FIG. 6, the bonding pad section 80 has a plurality of partial opening sections in the form of a matrix divided by dielectric layers 22a. A unit section 86 is disposed in each of the partial opening sections 81. The unit section 86 has a structure in a plan view in which a barrier layer 52 (not shown in FIG. 6), the first conduction layer 82 and the second conduction layer 84 in this order from the outside are concentrically disposed. The bonding pad section 80 is located at an opening region 32 (to be described below) of the protection layer 30. An exposed surface of the bonding pad section 80 defines a bonding region.

In accordance with the present embodiment, the second conduction layer 84 is formed from a material different from that of the first conduction layer 82, and the material thereof may be selected in consideration of the bonding property, cohesion with respect to the first conduction layer 82, anti-corrosion property, moisture resistance property and assembly and mounting property.

For example, when a copper-base material is used for the uppermost wiring layer 62, aluminum-base material or gold-base material may be used for the second conduction layer. As a result, good quality wire bonding using gold or aluminum, and good quality bonding by bumps using gold, silver, lead or solder can be achieved.

Protection Layer 30: A dielectric protection layer 30 may be formed over the uppermost layer. The protection layer 30 protects the functions within the semiconductor device 100, and can be formed from a known protection layer, such as, for example, a silicon nitride layer, a silicon oxide layer, or a silicon oxide nitride layer. The protection layer 30 defines an opening section 32 that exposes a specified region of the bonding pad section 80. The protection layer 30 may be formed from a plurality of stacked layers including, for example, a silicon oxide layer, a silicon nitride layer and the like, if required. Furthermore, a resin layer composed of, for example, polyimide resin for alleviating stresses can be deposited over the above-described various silicon compound layers.

In accordance with the semiconductor device 100, the uppermost wiring layer 62 is formed from a first conduction layer, and the bonding pad section 80 includes the unit sections 86 each having the first conduction layer and a second conduction layer that is different from the first conduction layer 82. Also, in the bonding pad section 80, the unit sections 86 that expose the plural conduction layers 82 and 84 composed of different materials are arranged in a matrix. Therefore, by selecting appropriate materials for the plurality of conduction layers 82 and 84, the bonding pad section 80 may be used for bonding with wires or bumps that may be formed from a variety of materials, in other words, the bonding pad section 80 may be formed with a high level of applicability to various bonding methods.

Not only materials for the conduction layers but also kinds of materials for the conduction layers and area ratios among the conduction layers may be selected to form bonding pad sections of a variety of embodiments.

In accordance with the present embodiment, a material for the first conduction layer 82 may be selected mainly in view of the function of a wiring layer. A material for the second conduction layer 84 may be selected mainly in view of the function of a bonding pad section. As a result, by appropriately selecting materials for the conduction layers, the uppermost wiring layer 62 and the bonding pad section 80 can be highly optimized.

Moreover, because the bonding pad section 80 includes the dielectric layers 22a of a specified pattern that form the partial opening sections 81, various advantages may be obtained. For example, the generation of a dishing in the CMP step is inhibited or prevented, contact areas of the first conduction layers 82 with the barrier layer 52 or the cohesion layer may increase so that the cohesion of the conduction layers can be improved, and the stress that is generated by the bonding operation and works on the bonding pad section 80 is dispersed.

Next, a method for manufacturing the semiconductor device 100 in accordance with an embodiment of the present invention is described. FIGS. 1 through 5 schematically show cross-sectional views of the semiconductor device 100 in different manufacturing steps.

Figure 1:
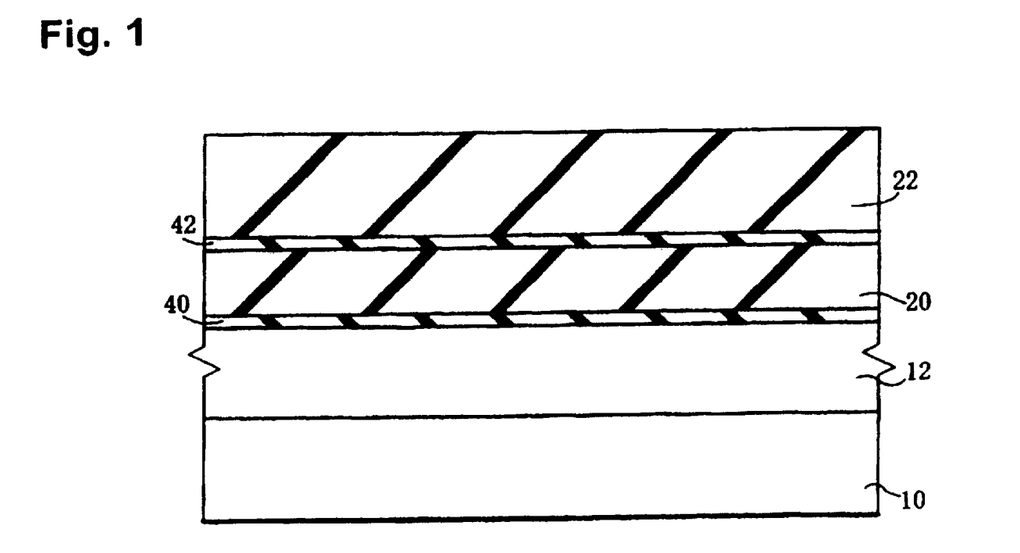
FIG. 1 schematically shows a cross-sectional view illustrating one step of a method for manufacturing a semiconductor device in accordance with an embodiment of the present invention.

(1) First, the description is made with reference to FIG. 1. FIG. 1 shows a step in which an uppermost interlayer dielectric layer 20 and an uppermost dielectric layer 22 are formed over an intermediate region 12. Each of wiring layers and via-contact layers can be formed by a known damascene process, for example by a dual-damascene process in accordance with the present embodiment.

Formation Of Semiconductor Devices And Intermediate Region 12: Semiconductor elements such as MOSFETs, bipolar transistors and the like, wiring layers and element isolation regions are formed over a surface of a silicon substrate 10.

Then, one or more sets of an interlayer dielectric layer in which an interlayer contact layer such as a via-contact layer is formed and a dielectric layer in which a wiring layer is formed are formed in layers over the silicon substrate 10 in which the semiconductor devices are formed by a known method to thereby form the intermediate region 12. The wiring layers and via-contact layer in the intermediate layer 12 can be formed by a known damascene process.

Formation Of Uppermost Interlayer Dielectric Layer 20 And Uppermost Dielectric Layer 22: First, an uppermost dielectric layer (not shown) of the intermediate region 12 and wiring layers (not shown) formed in the uppermost dielectric layer of the intermediate region 12 are planarized by, for example, a CMP method, and then an interlayer barrier layer 40 is formed. The material of the interlayer barrier layer is not particularly limited to a specific type as long as it can function as a barrier layer as described above. For example, the interlayer barrier layer can be formed from silicon nitride, silicon nitride oxide and silicon carbide. Furthermore, the interlayer barrier layer may preferably be formed from a material that can function as an etching stopper layer at a bottom of a via hole that is to be formed. The interlayer barrier layer may be formed by, for example, a sputter method and a CVD method. Also, the thickness of the interlayer barrier layer is selected in a range that can achieve its intended function.

Then, an uppermost interlayer dielectric layer 20 is formed over the interlayer barrier layer 40. The uppermost interlayer dielectric layer 20 is preferably formed from a known layer mainly composing silicon oxide. The interlayer dielectric layer 20 can be formed by, for example, a high-density plasma CVD method, a thermal CVD method, a plasma CVD method, a normal-pressure CVD method, a coating method such as a spin-coat method, a sputter method and a thermal vapor deposition method. The thickness of the interlayer dielectric layer 20 is selected depending on device designs.

Then, a mask layer 42 is formed over the uppermost interlayer dielectric layer 20. The material for the mask layer is not limited to a particular type as long as it can function as a mask layer. For example, the mask layer can be formed from silicon nitride, silicon nitride oxide and silicon oxide. Furthermore, the mask layer may preferably be formed from a material that can function as an etching stopper layer when via-holes are formed. The mask layer 42 may be formed by, for example, a CVD method. Also, the thickness of the mask layer is selected in a range that can achieve its intended function.

Then, an uppermost dielectric layer 22 is formed over the mask layer 42. The uppermost dielectric layer 22 is formed from a known layer mainly composing silicon oxide. The uppermost dielectric layer 22 may be formed by the same film forming method used for forming the uppermost interlayer dielectric layer 20.

The thickness of each of the layers is determined based on the design rule or the like. Examples of film thickness of the respective layers are shown below.

Interlayer barrier layer 40: several ten~200 nm

Uppermost interlayer dielectric layer 20: several hundred~1500 nm

Mask layer 42: several ten~200 nm

Uppermost dielectric layer 22: 500~2000 nm (2) As shown in FIG. 2, an uppermost via-hole 60a, a wiring groove 62a and an opening region 80a for the bonding pad section are formed.

In this process, for example, the uppermost dielectric layer 22 is patterned by a photolithography and etching (e.g., photo-etching) to form the wiring groove 62a. Then, opening sections are formed by a photo-etching method in the mask layer 42 at specified locations (where via-holes are formed), and then the uppermost interlayer dielectric layer 20 is etched using the mask layer 42 as a mask to form the via-holes 60a. In this process, the opening region 80a for the bonding pad section is formed at the same time when the wiring groove 62a is formed.

In this process, an opening section in which the via-hole 60a continuously connects to the wiring groove 62a and an opening section in which the via-hole 60a continuously connects to the opening section 80a for the bonding pad section are formed. Also, in the opening region 80a, as shown in FIG. 6, a patterning is conducted to leave the dielectric layers 22a in a specified pattern (a lattice pattern in the present embodiment) to thereby form a plurality of partial opening sections 81 arranged in a matrix configuration.

An etching method, preferably a dry etching method, and more preferably a high-density plasma etching may be used to form the wiring groove and the via-holes. When the dry etching method is used, its etching conditions (for example, etchant, plasma density, pressure and temperature) may be adjusted to change the etching rate for the dielectric layer and the etching rate for the mask layer independently from one another.

The formation of the wiring groove and the via-holes by a dual-damascene method is not limited to the method described above, and can use another method. For example, instead of the method described above, a so-called via-fast method can be utilized. According to the via-fast method, the via-holes 60a that pass through the uppermost dielectric layer 22 and the uppermost interlayer dielectric layer 20 are formed first, and then, the wiring groove 62a is formed in the dielectric layer 22.

Figure 3:
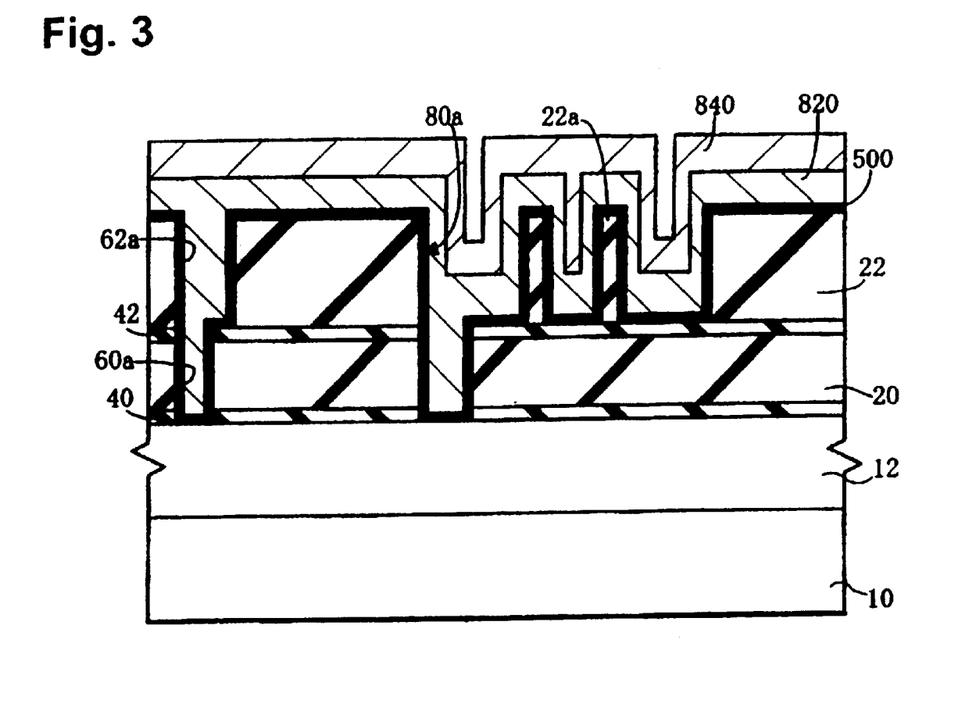
FIG. 3 schematically shows a cross-sectional view illustrating one step of a method for manufacturing a semiconductor device in accordance with an embodiment of the present invention.
Figure 4:
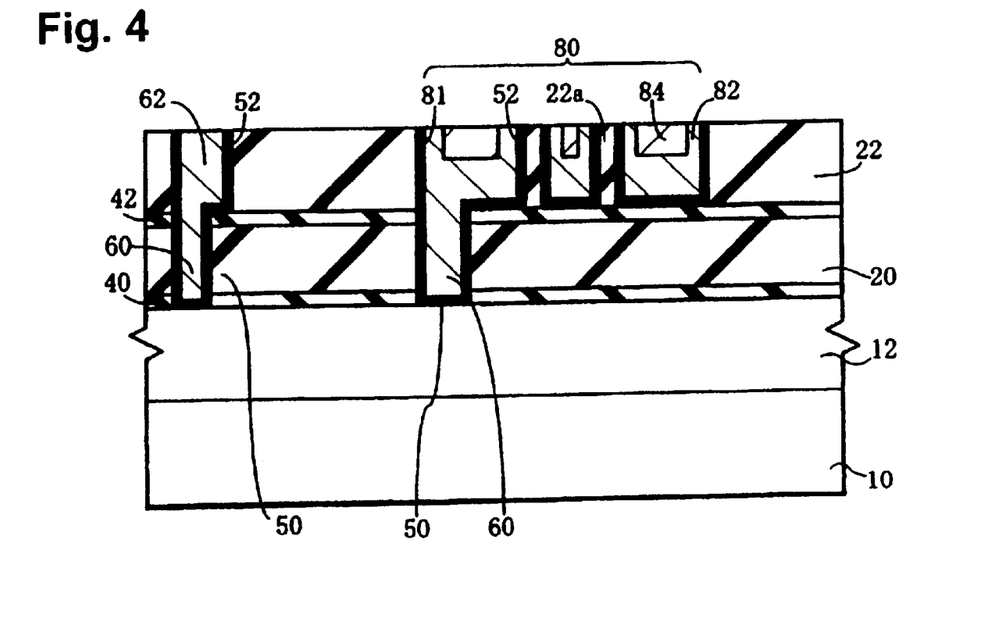
FIG. 4 schematically shows a cross-sectional view illustrating one step of a method for manufacturing a semiconductor device in accordance with an embodiment of the present invention.

(3) As shown in FIGS. 3 and 4, an uppermost via-contact layer 60 and an uppermost wiring layer 62 are formed.

First, as shown in FIG. 3, a barrier layer 500 is preferably formed along internal walls of the via-holes 60a, the wiring groove 62a and the opening region 80a for the bonding pad section. The barrier layer 500 may preferably be formed by a sputter method or a CVD method. The film thickness of the barrier layer 500 is selected to be in a range that can achieve its intended function, and is 10–100 nm, for example.

Then, a first conduction layer 820 for via-contact layers and wiring layers is formed over the barrier layer 500, and then a second conduction layer 840 for the bonding pad section is formed.

In one embodiment, the first conduction layer 820 is formed first. In this instance, the first conduction layer 820 is formed in a manner that at least the via-holes 60a and the wiring groove 62a are buried by the conduction layer 820. Therefore, the thickness of the first conduction layer 820 is set depending on the diameter of the via-hole 60a and the width of the wiring groove 62a. It is noted that the thickness of the first conduction layer 820 refers to, for example, the film thickness of the conduction layer over the uppermost dielectric layer 22.

Also, the film thickness of the first conduction layer 820 needs to be smaller than the thickness of the bonding pad section 80 (see FIG. 4), in other words, the film thickness of the uppermost dielectric layer 22 (see FIG. 4) that is finally obtained. If the film thickness of the first conduction layer 820 is greater than the film thickness of the uppermost dielectric layer 22 that is finally obtained, the second conduction layer 84 (see FIG. 4) composed of a material different from that of the first conduction layer 82 cannot be left over the bonding pad section 80.

The first conduction layer 820 may be formed by, for example, a CVD method, a method using plating, a sputter method, a vapor deposition method, a coating method or a method combining the aforementioned methods.

When a copper-base material is used for the first conduction layer 820, the layer can be formed by, for example, a sputter method, a plating method or a CVD method. For example, when a plating method is used, copper is preferably deposited to a film thickness of several ten–several hundred nm as a seed layer over the surface of the barrier layer 500 by using a sputter method, and then, copper is formed thereon to a specified film thickness (for example, 300–1000 nm) by a plating method.

Then, depending on the requirements, a layer of metal such as titanium, tantalum, niobium or tungsten, or a layer of alloy of the aforementioned metals (not shown) is formed to a preferred film thickness of several ten nm by a sputter method. Such a layer may function as a cohesion layer and a flow layer.

Next, a second conduction layer 840 is formed over the first conduction layer 820. The second conduction layer 840 may be formed by the same method used for forming the first conduction layer 820.

The second conduction layer 840 forms the second conduction layer 84 of the bonding pad section 80, and therefore may preferably be formed with a metal having a good bonding property, as described above. When an aluminum-base material is used for the second conduction layer 840, the conduction layer 840 can preferably be formed to a film thickness of several hundred nm by a sputter method.

The film thickness ratio between the first conduction layer 820 and the second conduction layer 840 and the size of the opening section 80a for the bonding pad section 80 may be controlled to set an area ratio between upper surfaces of the first conduction layer 82 and the second conduction layer 84 of the bonding pad section 80.

Examples of the width of the wiring groove 62a, the diameter of the opening region 80a for the bonding pad section 80, the film thickness of the first conduction layer 820 and the film thickness of the second conduction layer 840 are shown below.

The width of the wiring groove: 0.15–10 μm

The diameter of the opening section for the bonding pad section: 30–150 μm

The film thickness of the first conduction layer: 300–1000 nm

The film thickness of the second conduction layer: 100–500 nm (4) As shown in FIGS. 3 and 4, excess portions of the second conduction layer 840, the first conduction layer 820, the barrier layer 500 and the uppermost dielectric layer 22 are planarized, to thereby form the uppermost dielectric layer 22, the uppermost wiring layer 62 and the bonding pad section 80. As described above, the bonding pad section 80 has a stacked layered structure in which the second conduction layer 84 is deposited over the first conduction layer 82. In one embodiment, in each of the unit sections 86, the first conduction layer 82 is disposed in a manner to encircle the second conduction layer 84.

The planarization method may be conducted by using, for example, a CMP method, a dry etching method or a wet removal method, and more preferably by a CMP method.

(5) As shown in FIG. 5, a dielectric protection layer 30 is formed over the uppermost layer, in other words, the uppermost dielectric layer 22. The protection layer 30 may be formed with a material layer, such as, for example, a silicon nitride layer, a silicon oxide layer and a silicon oxide nitride layer, as described above. An opening section 32 is formed in the protection layer 30 by photolithography and etching in a manner that a specified region of the bonding pad section 80 is exposed.

In the manner described above, the semiconductor device 100 in accordance with an embodiment of the present invention is completed.

In the manufacturing method described above, as shown in FIG. 2, the wiring groove 62a for the uppermost wiring layer 62 as well as the opening region 80a for the bonding pad section 80 are formed in the uppermost dielectric layer 22. Then, as shown in FIG. 3, the first conduction layer 820 for the wiring layer 62 and the second conduction layer 840 are deposited in a manner to fill the partial opening sections 81 of the opening region 80a for the bonding pad section 80. Furthermore, as shown in FIG. 4, the second conduction layer 840, the first conduction layer 820 and the uppermost dielectric layer 22 are planarized such that the wiring layer 62 composed of the first conduction layer 820 is formed in the wiring groove 62a, and at the same time, the first conduction layers 82 and the second conduction layers 84 are formed within the partial opening sections 81 of the opening region 80a for the bonding pad section 80.

As described above, the opening region 80a for the bonding pad section 80 may be divided by the dielectric layers 22a having a specified pattern to thereby form the plural partial opening sections 81. Also, the first conduction layer 82 and the second conduction layer 84 may be formed in each of the partial opening sections 81. As a result, one damascene process can form the bonding pad section 80 with exposed portions of the plural conduction layers being arranged in a matrix configuration.

Furthermore, as described above, the wiring layer 62 and the bonding pad section 80 may be simultaneously formed in a damascene process (a dual-damascene process in accordance with the present embodiment) for forming the bonding pad section 80. Therefore, the bonding pad section 80 and the wiring layer 62 can be formed with a simple process without increasing the number of steps of the damascene process or adding steps of forming and patterning other films after the damascene process. As a result, the yield is improved and the cost is reduced.

In certain embodiments as described above, examples in which the wiring layer is formed from a copper-base material or an aluminum-base material are described. However, other materials, such as, for example, a silver-base material and a gold-base material can be used. Also, wiring layers at different levels may be formed with the same material or different materials. For example, a wiring layer that is close to the silicon substrate may be formed from an aluminum-base material and an upper layer that is fed with a larger current may be formed from a copper-base material.

The pattern of the partial opening sections of the bonding pad section is not limited to a matrix pattern, but can be in a variety of different configurations such as a ring shape as long as the pattern can divide the bonding pad section.

Also, the plan shape of the bonding pad section is not limited to square, but can be any one of a variety of shapes, such as, for example, parallelogram such as rectangle, polygon such hexagon, circle and the like.

Furthermore, in the embodiment described above, the bonding pad section is composed of two conduction layers. However, the bonding pad section can be composed of three or more layers depending on the requirements.

In summary, the preferred embodiments are applicable to semiconductor devices in which bonding pad sections are formed by a damascene process, and enables simultaneous formation of uppermost wiring layers and the bonding pad sections in a common step.

What is claimed is:

1. A semiconductor device comprising:

a plurality of wiring layers and dielectric layers interposed between the mutual wiring layers, and a bonding pad section in an uppermost dielectric layer;

wherein the bonding pad section comprises an opening region having a plurality of partial opening sections divided by dielectric layers, and a plurality of conduction layers each comprising of different materials and exposed in each of the partial opening sections.

2. A semiconductor device according to claim 1, wherein an uppermost wiring layer is disposed over the uppermost dielectric layer together with the bonding pad section.

3. A semiconductor device according to claim 2, wherein the conduction layer for the wiring layer is formed from a lowermost conduction layer among the plurality of conduction layers.

4. A semiconductor device according to claim 2, wherein each of the partial opening sections that form the opening region has concentrically disposed different conduction layers in which the conduction layer for the wiring layer is provided in an outermost layer.

5. A semiconductor device according to claim 4, wherein a single or plural conduction layers are provided inside the conduction layer for the wiring layer.

6. A semiconductor device according to claim 1, further comprising a dielectric protection layer formed at an uppermost layer, the dielectric protection layer having an opening section that exposes the bonding pad section.

7. A semiconductor device according to claim 2, wherein the conduction layer for the wiring layer is formed from a layer comprising at least one metal selected from aluminum, copper, silver and a metal alloy thereof, and an upper layer above the conduction layer for the wiring layer is formed from a material different from the conduction layer for the wiring layer, and is formed from a layer comprising at least one metal selected from aluminum, gold and a metal alloy thereof.

8. A semiconductor device according to claim 1, further comprising at least one of a barrier layer and a cohesion layer formed over a surface of the partial opening sections for the bonding pad section.

* * * * *